United States Patent
Kondoh

(10) Patent No.: US 9,144,162 B2
(45) Date of Patent: Sep. 22, 2015

(54) DISPLAY DEVICE AND FRAME MEMBER

(71) Applicant: Sharp Kabushiki Kaisha, Osaka-shi, Osaka (JP)

(72) Inventor: Kazuya Kondoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/366,799

(22) PCT Filed: Dec. 20, 2012

(86) PCT No.: PCT/JP2012/083104
§ 371 (c)(1),
(2) Date: Jun. 19, 2014

(87) PCT Pub. No.: WO2013/099765
PCT Pub. Date: Jul. 4, 2013

(65) Prior Publication Data
US 2014/0347844 A1 Nov. 27, 2014

(30) Foreign Application Priority Data
Dec. 26, 2011 (JP) ................. 2011-283828

(51) Int. Cl.
*G09F 13/04* (2006.01)
*H05K 5/02* (2006.01)
*G02F 1/1333* (2006.01)
*A47B 81/06* (2006.01)
*H05K 5/00* (2006.01)
*H05K 7/18* (2006.01)

(52) U.S. Cl.
CPC .............. *H05K 5/0217* (2013.01); *A47B 81/06* (2013.01); *G02F 1/133308* (2013.01); *H05K 5/0017* (2013.01); *H05K 7/18* (2013.01); *G02F 2001/133317* (2013.01); *G02F 2201/503* (2013.01)

(58) Field of Classification Search
CPC ................ G02F 1/33308; A61G 2007/509; A61G 2007/0514
USPC ....................................... 362/97.1
See application file for complete search history.

(56) References Cited

FOREIGN PATENT DOCUMENTS

JP 2009-092716 A 4/2009

OTHER PUBLICATIONS

Official Communication issued in International Patent Application No. PCT/JP2012/083104, mailed on Mar. 12, 2013.

*Primary Examiner* — Vip Patel
(74) *Attorney, Agent, or Firm* — Keating & Bennett, LLP

(57) ABSTRACT

A display device includes a frame body (15) formed by joining a plurality of frame members (15a to 15f) for supporting a circumferential end portion of a display panel (2), wherein a cushioning material (17a) of a first frame member (15a) of the plurality of frame members includes a protruding portion (Ta) protruding toward a second frame member (15b) to be joined to the first frame member and a recessed portion (Ha) recessed inwardly, and a cushioning material (17b) of the second frame member (15b) includes a recessed portion (Hb) recessed inwardly so as to correspond to the protruding portion (Ta) of the cushioning material (17a) of the first frame member and a protruding portion (Tb) protruding so as to correspond to the recessed portion (Ha) of the cushioning material (17a) of the first frame member (15a).

8 Claims, 13 Drawing Sheets

DISPLAY DEVICE AND FRAME MEMBER

TECHNICAL FIELD

The present invention relates to a structure of a display device having a frame body for supporting a display panel.

BACKGROUND ART

In recent years, as a display portion of electrical products such as computers and televisions, for example, a flat display device (flat panel display) such as a liquid crystal display device has been used widely.

In the aforementioned display device, the positional relationship between a base portion such as a backlight unit and a display panel is fixed by supporting a circumferential end portion of the display panel with a frame body. A cushioning material may be provided on the frame body for supporting the circumferential end portion of the display panel. For example, in a liquid crystal display device described in the following Patent Document 1, a cushioning material is provided between a bezel and a liquid crystal display panel. Consequently, display quality is prevented from being degraded in a wide temperature range.

PRIOR ART DOCUMENT

Patent Document

Patent document 1: JP 2009-92716 A

DISCLOSURE OF INVENTION

Problem to be Solved by the Invention

In some cases, it is preferred that a frame body for supporting a display panel be formed of a combination of a plurality of frame members. For example, a frame body for supporting a large display panel is preferably formed of a combination of divided P chassis.

In this case, a cushioning material such as cushion rubber can be attached to each frame member. The cushioning material is attached to the frame member with a margin, considering problems such as attachment accuracy. This is because, when the cushioning material extends off the frame member, it becomes difficult to assemble the frame member.

When the cushioning material is formed so as to be smaller by the margin than the frame member, a gap between the cushioning materials is formed at a seam of the frame members. This gap is visible from a display surface of the display panel, which may degrade display quality.

Therefore, it is an object of the present invention to enhance display quality by making a gap between cushioning materials of a frame body for supporting a display panel hardly visible.

Means for Solving Problem

A display device according to an embodiment of the present invention, includes:
 a display panel; and
 a frame body formed by joining a plurality of frame members for supporting a circumferential end portion of the display panel,
 wherein a cushioning material is provided on each of the plurality of frame members, and
 a cushioning material of a first frame member of the plurality of frame members includes a protruding portion protruding toward a second frame member to be joined to the first frame member and a recessed portion recessed inwardly in an end portion, and a cushioning material of the second frame member includes a recessed portion recessed inwardly so as to correspond to the protruding portion of the cushioning material of the first frame member and a protruding portion protruding so as to correspond to the recessed portion of the cushioning material of the first frame member.

Effects of the Invention

According to the disclosure of the present application, display quality can be enhanced by making a gap between cushioning materials of a frame body for supporting a display panel hardly visible.

DESCRIPTION OF THE INVENTION

Figure 1:
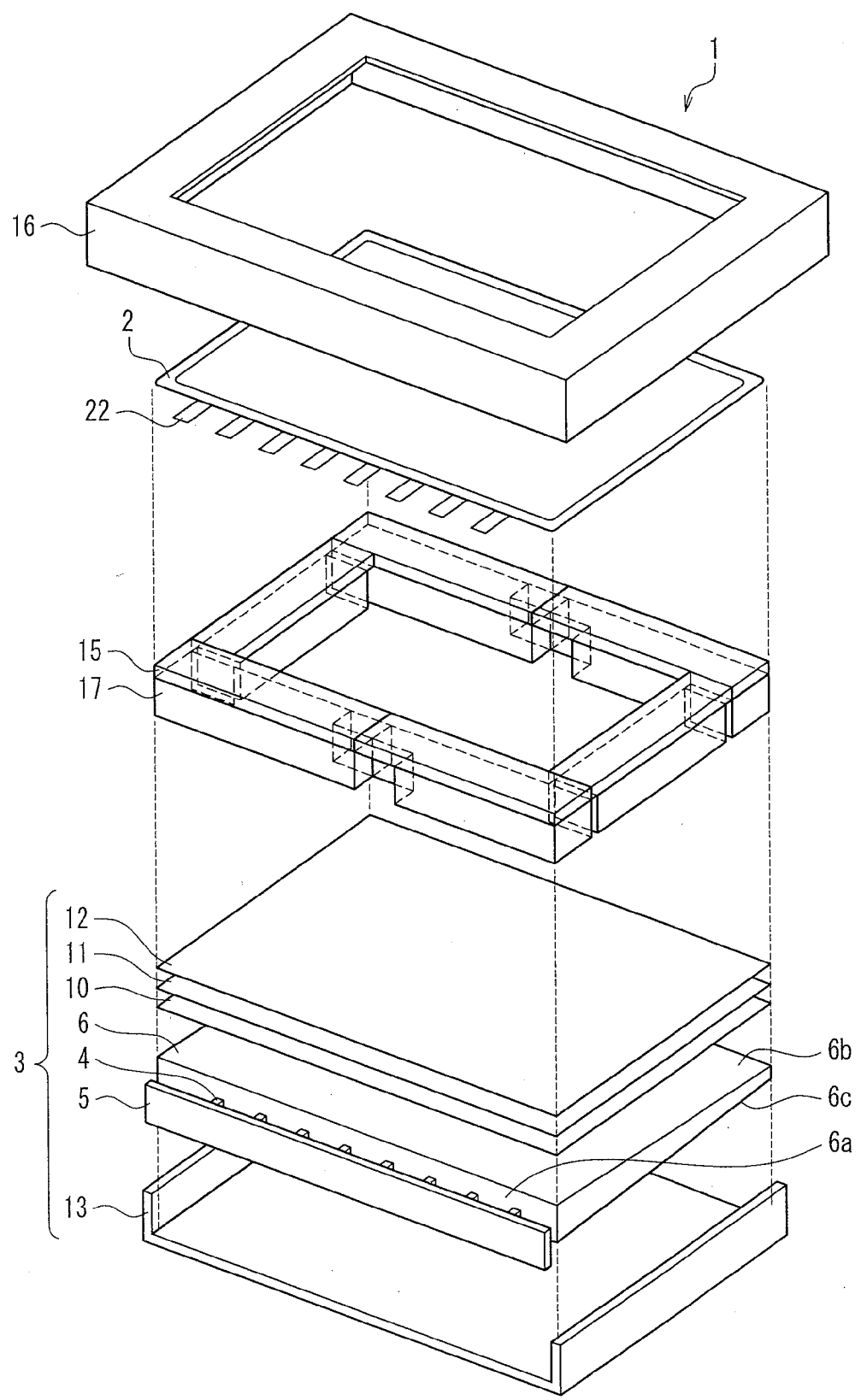
FIG. 1 is a view illustrating a liquid crystal display unit according to Embodiment 1 of the present invention.

In a display device according to an embodiment of the invention of the present application, in a joined portion between a first frame member and a second frame member, a protruding portion of a cushioning material of the first frame member is disposed so as to be opposed to a recessed portion of a cushioning material of the second frame member, and a recessed portion of the cushioning material of the first frame member is disposed so as to be opposed to a protruding portion of the cushioning material of the second frame member. Therefore, even when a gap is formed between the cushioning material of the first frame member and the cushioning material of the second frame member, the position of a gap between the protruding portion of the cushioning material of the first frame member and the recessed portion of the cushioning material of the second frame member is shifted from the position of a gap between the recessed portion of the cushioning material of the first frame member and the protruding portion of the cushioning material of the second frame member. This shift makes the gap between the cushioning materials in the frame body hardly visible from a display surface side.

In the above-mentioned display device, the protruding portion of the cushioning material of the first frame member may be provided on a display surface side of the display panel along the display surface.

According to the above-mentioned configuration, the protruding portion of the cushioning material is provided along a display region in a joined portion of the frame members, and hence a gap between the protruding portion and the recessed portion corresponding thereto are also disposed along the display region. Consequently, the gap becomes more hardly visible.

In the above-mentioned display device, the protruding portion of the cushioning material of the first frame member may be provided on a display surface side of the display panel along the display surface, and a thickness of the protruding portion of the cushioning material of the first frame member may be smaller than a thickness of a remaining portion of the cushioning material of the first frame member.

According to the above-mentioned configuration, a gap between the protruding portion of the cushioning material of the first frame member provided along the display surface in the joined portion of the frame members and the recessed portion of the cushioning material of the second frame member corresponding to the protruding portion is smaller than a portion other than the protruding portion of the cushioning material of the first frame member. Therefore, the gap that is visible from the display surface becomes smaller.

In the above-mentioned display device, the protruding portion of the cushioning material of the first frame member is provided on the display surface side of the display panel along the display surface, and the protruding portion has a shape in which a protrusion becomes large with distance from the display surface, and the recessed portion of the cushioning material of the second frame member corresponding to the protruding portion has a shape in which an inward recess becomes small with distance from the display surface.

According to the above-mentioned configuration, the gap between the protruding portion of the cushioning material along the display surface and the recessed portion of the cushioning material corresponding to the protruding portion becomes smaller with distance from the display surface to a deeper side. Therefore, the gap becomes more hardly visible.

In the display device, a gap between the protruding portion of the cushioning material of the first frame member and the recessed portion of the cushioning material of the second frame member and a gap between the recessed portion of the cushioning material of the first frame member and the protruding portion of the cushioning material of the second frame member are disposed so as not to overlap each other under a condition that the first frame member and the second frame member are joined to each other.

According to the above-mentioned configuration, a position of the gap caused by the protruding portion of the cushioning material of the first frame member and a position of the gap caused by the recessed portion are formed so as to be shifted without overlapping each other. Consequently, the gap between the cushioning materials does not pass through an inner side and an outer side of the frame body. Therefore, dust is prevented from entering from the outer side to the inner side.

In the display device, the frame body may be provided between the display panel and an illumination unit for illuminating the display panel with light, and the cushioning material may be provided between the frame body and the illumination unit. Further, the display panel can be a liquid crystal panel. Further, the frame member used in the above-mentioned display device is also one embodiment of the present invention.

Hereinafter, preferred embodiments of the display device of the present invention are described with reference to the drawings. It should be noted that the following description is made by illustrating the case in which the present invention is applied to a transmission type liquid crystal display device. Further, the dimension of each constituent member in the respective figures does not faithfully reflect the actual dimension of a constituent member, actual dimension ratio of each constituent member, and the like.

Embodiment 1

Configuration Example of Liquid Crystal Display Device

FIG. 1 is a view illustrating a liquid crystal display device according to Embodiment 1 of the present invention. In FIG. 1, in a liquid crystal display device 1 of the present embodiment, a liquid crystal panel 2 that is an example of a display panel for displaying information and a backlight device 3 that is an example of an illumination unit are provided. Then, in the liquid crystal display device 1, the liquid crystal panel 2 displays information through use of illumination light from the backlight device 3. The liquid crystal panel 2 and the backlight device 3 are integrated as a transmission type liquid crystal display device.

The liquid crystal panel 2 includes a liquid crystal layer and an active matrix substrate and a color filter substrate serving as a pair of substrates including the liquid crystal layer interposed therebetween (not shown). In the active matrix substrate, pixel electrodes, thin film transistors (TFTs), and the like are formed between the active matrix substrate and the liquid crystal layer in accordance with a plurality of pixels included in a display surface of the liquid crystal panel 2. On the other hand, in the color filter substrate, a color filter, a common electrode, and the like are formed between the color filter substrate and the liquid crystal layer (not shown).

Further, control portions 22 (e.g., source drivers) for driving and controlling the liquid crystal panel 2 are provided on the liquid crystal panel 2 and drive the display surface on a pixel basis by operating the liquid crystal layer on a pixel basis to display a desired image on the display surface. It should be noted that, although not shown, the control portions 22 provided on the liquid crystal panel 2 may be connected to a control circuit for generating a drive signal based on input image information. The control circuit can be formed, for example, on a substrate disposed on a back surface side of the backlight device 3. This substrate is preferably covered with a substrate cover.

The backlight device 3 includes light-emitting diodes 4 serving as light sources, an LED substrate 5 serving as a light source substrate on which the light-emitting diodes 4 are mounted, and a light-guiding plate 6 for guiding light from the light-emitting diodes 4 in a predetermined propagation direction and outputting the light to the liquid crystal panel (object to be irradiated) 2 side. The light-guiding plate 6 is formed of, for example, a transparent synthetic resin having a rectangular cross-section such as an acrylic resin. The light-guiding plate 6 is disposed so as to be opposed to the light-emitting diodes 4. The light-guiding plate 6 includes a light-receiving surface 6a for receiving light from the light-emitting diodes 4, a light-outputting surface 6b for outputting light to the liquid crystal panel 2 side, and an opposed surface 6c opposed to the light-outputting surface 6b.

For example, a diffusion sheet 10, a prism sheet 11, and a reflection type polarizing sheet 12 are provided as optical members between the light-guiding plate 6 and the liquid crystal panel 2 successively from the light-guiding plate 6 side. Further, for example, a reflective plate (not shown) for reflecting light from the light-emitting diodes 4 and the light-guiding plate 6 may be provided on the opposed surface 6c side of the light-guiding plate 6 or on the periphery of the light-emitting diodes. The optical members and the reflective plate can convert light output from the light-outputting surface 6b of the light-guiding plate 6 into flat illumination light having uniform brightness and provide the illumination light to the liquid crystal panel 2.

Further, the backlight device 3 includes a bottomed BL chassis 13 accommodating the light-emitting diodes 4, the light-guiding plate 6, and the diffusion sheet 10, the prism sheet 11, and the reflection type polarizing sheet 12. In the example shown in FIG. 1, the light sources, the light-guiding plate, and the optical sheets are disposed in the bottomed BL chassis 13, and the bottomed BL chassis 13 is covered with a P chassis 15 serving as a frame body having an opening from above. The BL chassis 13 can form an outer container (housing) of the backlight device 3. Further, the opening of the P chassis 15 is disposed at a position corresponding to a surface (light-outputting surface 6b in the example shown in FIG. 1) for outputting light from the light-emitting diodes 4 serving as light sources.

The P chassis 15 serves as a frame body for fixing the liquid crystal panel 2 to the backlight device 3 by supporting the circumferential end portion of the liquid crystal panel 2. The P chassis 15 is formed by joining a plurality of frame members. Cushioning materials 17 are provided on a surface of the P chassis 15 opposite to the liquid crystal panel 2 side. The cushioning materials 17 are respectively attached to the plurality of frame members forming the P chassis 15. In each frame member, the cushioning material is formed along the shape of a frame formed by the frame member. The cushioning material 17 is, for example, cushion rubber. In this example, the cushioning material 17 also has a function of pressing the optical sheets of the backlight device 3.

In the example shown in FIG. 1, the P (plastic) chassis 15 is set on the BL chassis 13, and the liquid crystal panel 2 is placed on the P chassis 15. Thus, the liquid crystal panel 2 and the backlight device 3 are assembled with each other. The liquid crystal panel 2 disposed on the backlight device 3 through intermediation of the P chassis 15 is covered with a bezel 16 from the display surface side. The liquid crystal panel 2 is interposed to be fixed between the bezel 16 and the P chassis 15 so that the display surface is opposed to the bezel 16 and a back surface of the display surface is opposed to the P chassis 15. It should be noted that the P chassis 15 shown in FIG. 1 is an example of a frame body for supporting the circumferential end portion of the display panel, and the backlight device 3 is an example of a base portion on which the display panel is mounted. The frame body for supporting the circumferential end portion of the display panel can support at least any one of the side surface, the display surface, and the back surface of the display panel.

It should be noted that the configuration of the outer container of the backlight device 3 is not limited to the BL chassis 13. For example, the BL chassis may have a configuration including a bottom portion and a frame body separately. Further, the frame body for fixing the positional relationship between the backlight device 3 and the liquid crystal panel 2 is not limited to the P chassis shown in FIG. 1. For example, the frame body for supporting the circumferential end portion of the liquid crystal panel 2 and the frame body for supporting the circumferential end portion of the backlight device 3 may be formed integrally as one frame.

Further, the backlight device 3 is not limited to the example shown in FIG. 1. For example, various light sources (fluorescent tubes such as a cold-cathode tube and a hot-cathode tube or discharge tubes such as a xenon tube) can be used as the light sources, besides the light-emitting diodes (LEDs). Further, the arrangement of the light sources shown in FIG. 1 is of an edge light type in which light sources are arranged along the side surface of the liquid crystal panel 2. However, as another example, a direct type in which light sources are arranged along the back surface of the liquid crystal panel 2 can be adopted. As an example, a direct type LED backlight can be used as the backlight device 3.

Further, the configurations of the frame body for supporting the circumferential end portions of the liquid crystal panel 2 and the cushioning material are not limited to those of the above-mentioned example. For example, a cushioning material may be disposed between the display panel and the frame body, or a cushioning material may be provided between the display panel and the bezel for supporting the end portion of the display surface of the display panel. In this case, the bezel serves as an example of a frame body formed by joining a plurality of frame members for supporting the circumferential end portion of the display panel. Thus, the cushioning material can be provided between the display panel and the frame body or between the base portion for fixing the display panel and the frame body.

(Configuration Example of Frame Body)

Figure 2C:
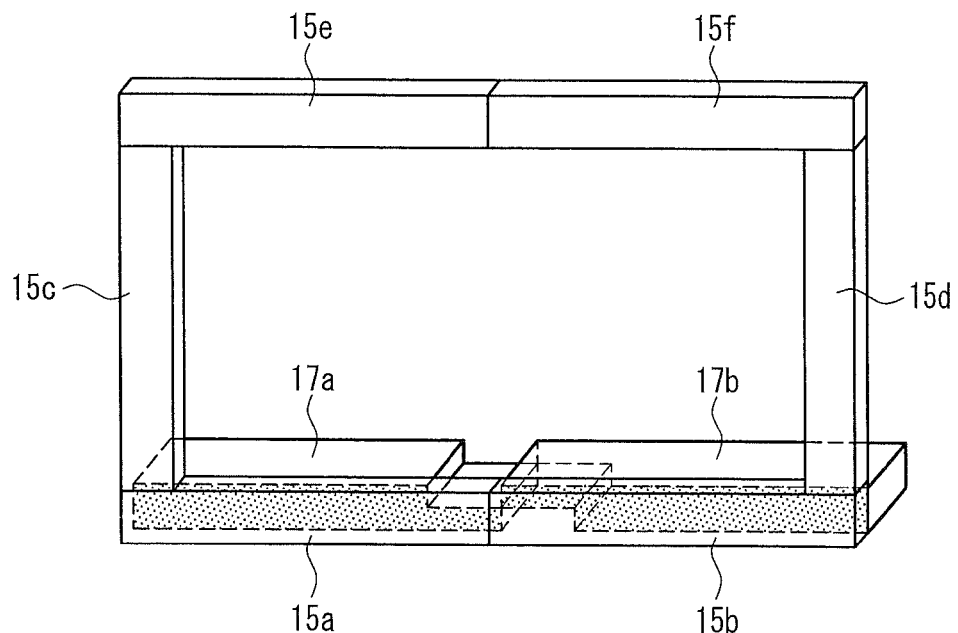
FIG. 2C is a view showing a configuration example of a frame body formed of the frame members shown in FIG. 2A.

Next, a specific example of a frame body for supporting the circumferential end portion of the liquid crystal panel 2 of the present embodiment is described with reference to FIG. 2. FIG. 2A is a view showing a configuration example of two adjacent frame members of those forming a P chassis 15 that is an example of the frame body. FIG. 2A shows a frame member 15a forming a lower edge left portion of a frame of the P chassis 15 and a frame member 15b forming a lower edge right portion thereof. Cushioning materials 17a, 17b are attached to back surfaces (back side of a surface on which the liquid crystal panel 2 is mounted) of the frame member 15a and the frame member 15b. In the respective frame members 15a, 15b, the cushioning materials 17a, 17b are formed so as to extend in a direction (right and left direction in FIG. 2A) in which the frame members extend.

In an end portion on a joined portion side of the frame member 15a and the frame member 15b, the cushioning material 17a of one frame member 15a has a protruding portion Ta protruding toward the other frame member 15b to be joined (connected) to the frame member 15a. In the end portion of the cushioning material 17a, a portion that does not serve as the protruding portion Ta serves as a recessed portion Ha. In this example, the protruding portion refers to a portion protruding further compared with the periphery in the end portion of the cushioning material, and the recessed portion refers to a portion recessed inwardly compared with the periphery.

The end portion on the joined portion side of the cushioning material 17b of the frame member 15b has a protruding portion Tb protruding toward the frame member 15a at a position corresponding to the recessed portion of the cushioning material 17a. In the end portion of the cushioning material 17b, a portion that does not serve as the protruding portion Tb serves as a recessed portion Hb.

Figure 2B:
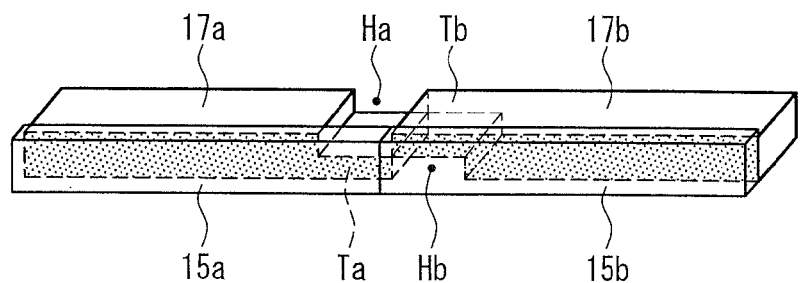
FIG. 2B is a view showing a state in which the frame members shown in FIG. 2A are joined to each other.
Figure 2A:
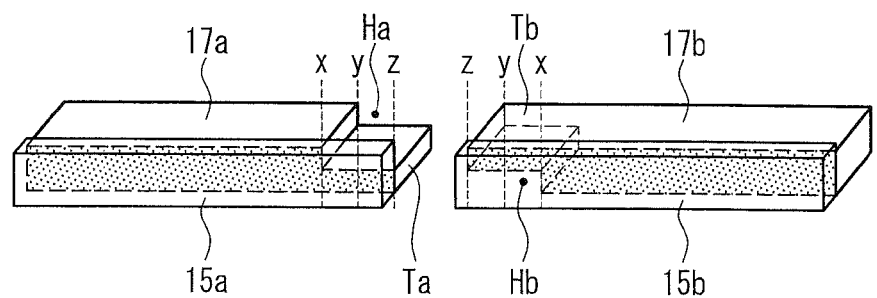
FIG. 2A is a view showing a configuration example of two adjacent frame members of those forming a frame body.

Thus, in the case where the frame member 15a and the frame member 15b are joined to each other, the protruding portion Ta of the cushioning material 17a is opposed to the recessed portion Hb of the cushioning material 17b, and the recessed portion Ha of the cushioning material 17a is opposed to the protruding portion Tb of the cushioning material 17b, as shown in FIG. 2B. When the frame members 15a, 15b are joined to each other, a gap may be formed between the protruding portion Ta of the cushioning material 17a and the recessed portion Hb of the cushioning material 17b in some cases. The reason for this is to consider attachment accuracy of the cushioning materials 17a, 17b, for example, as described later.

FIG. 2C is a view showing a configuration example of a frame body (P chassis 15 as an example) formed of a plurality of frame members including the frame members 15a, 15b. In the example shown in FIG. 2C, two left and right frame members 15a, 15b in a lower portion, two left and right frame members 15c 15d on side surfaces, and two left and right frame members 15e and 15f in an upper portion are combined to form the frame body (P chassis 15). For example, the liquid crystal panel 2 is disposed on a front surface of the P chassis 15, and the backlight device 3 is disposed on a back surface of the P chassis 15 through intermediation of the cushioning material 17. It should be noted that, in FIG. 2C, although cushioning materials of the frame members 15c, 15d, 15e, 15f on the side surfaces and in the upper portion are not shown, cushioning materials are also attached to the frame members 15c, 15d, 15e, 15f.

In the example of FIG. 2C, light emitted from the backlight device 3 passes through an inner side of the frame formed of the P chassis 15 to enter the liquid crystal panel 2. Therefore, the inner side of the frame serves as a display surface of the display device. The protruding portion Tb of the cushioning material 17b is provided on the display surface side (inner side of the frame formed of the frame members), and the protruding portion Ta of the cushioning material 17a is provided on a side (outer side of the frame) opposite to the display surface. The protruding portion Tb of the cushioning material 17b is provided on the display surface side along the display surface (circumference of a display region). In the cushioning materials 17a, 17b, portions protruding further compared with the remaining portions serve as the protruding portions Ta, Tb in a shape of a cross-section of each cushioning material on a plane parallel to the display surface, and portions recessed inwardly compared with the remaining portions serve as the recessed portions Ha, Hb.

In the configuration shown in FIG. 2C, the liquid crystal panel 2 on the front surface is irradiated with light of a backlight from the back surface of the P chassis 15, and an image is displayed on the liquid crystal panel 2. In this case, when the display surface of the liquid crystal panel 2 is viewed from an upper diagonal direction, upper ends of the cushioning materials 17a, 17b in the lower portion may be visible in some cases. In this case, when a gap between the cushioning materials 17a and 17b is large, display quality is degraded. In the present embodiment, the gap can be reduced in size to prevent display quality from being degraded by providing protruding portions in the end portions of the adjacent cushioning materials 17a and 17b and arranging the protruding portions so that they do not overlap each other.

Figure 3C:
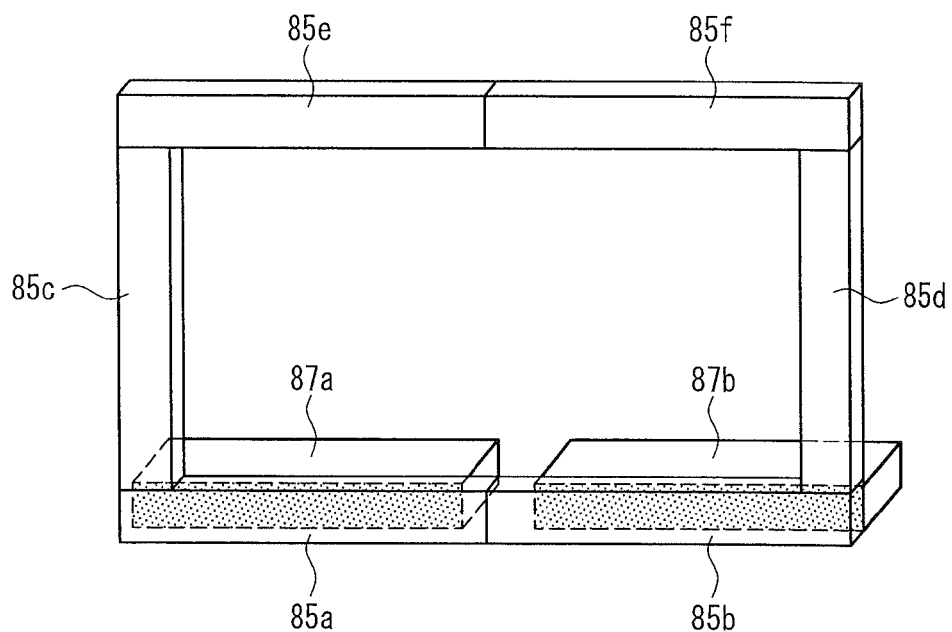
FIGS. 3A, 3B, and 3C are views showing a configuration example in which a protruding portion is not provided in an end portion of a cushioning material.
Figure 3B:
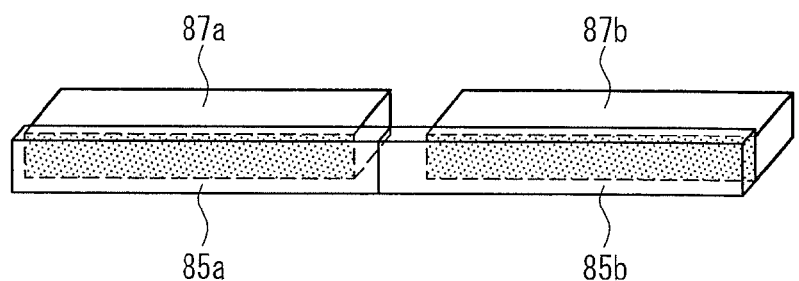
Figure 3A:
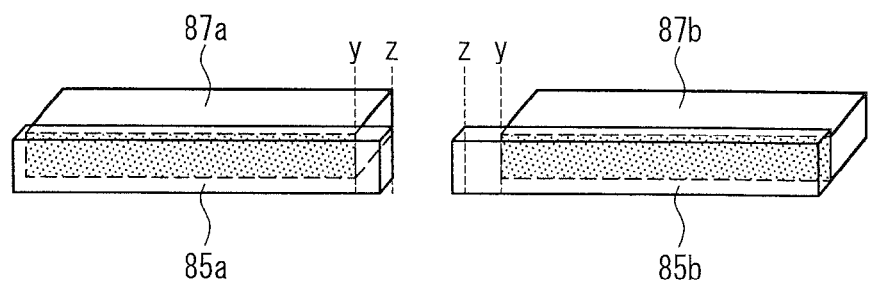

FIGS. 3A, 3B, and 3C are views showing a configuration example in which a protruding portion is not provided in an end portion of a cushioning material. In the example shown in FIG. 3A, cushioning materials 87a, 87b are respectively attached to two frame members 85a, 85b to be joined to each other. End portions of the cushioning materials 87a, 87b are provided on an inner side of the joined portion of the frame members 85a, 85b.

PORON (an example of the cushioning material 17) on the back side of the P chassis 85 is attached to the frame members 85a to 85f when the P chassis 85 is in the state of discrete components, that is, before the frame members 85a to 85 are assembled as the P chassis 85. Due to the problem of attachment accuracy, it is difficult to attach a cushioning material to a frame member so that the end portion of the cushioning material is matched with the end portion of the frame member. That is, it is difficult to attach a cushioning material to a frame member so that the end portion of the cushioning material is positioned as close as possible to a joined surface of the frame member. Therefore, a margin is provided between the end portion on the joined side of the frame member and the end portion of the cushioning material. Consequently, a gap is formed between the cushioning materials in the joined portion of the frame members.

For example, when a cushioning material extends off the end portion of a frame member of the P chassis 15, the frame member cannot be joined to an adjacent frame member, with the result that a P chassis cannot be assembled. Therefore, a cushioning material is attached to a frame member with an attachment margin of about several millimeters between the end portion of the frame member and the end portion of the cushioning material. In the example shown in FIG. 3A, the width of a margin corresponds to a distance between a dotted line "y" and a dotted line "z". Therefore, during assembly of a P chassis, a gap that is twice the attachment margin is formed in a TYP state (see FIGS. 3B and 3C).

In contrast, as shown in FIGS. 2A to 2C, for example, a cushioning material in a joined portion of a frame member can have a protruding portion protruding by the length that is twice or more of the attachment margin. In the example shown in FIG. 2A, the distance between dotted lines "y" and "z" corresponds to a margin width, and the distance between a dotted line "x" and the dotted line "z", which is twice the margin width, corresponds to a protrusion width of the protruding portion. That is, in the present example, as shown in FIG. 3, the distance, which is twice the attachment margin (distance between the dotted lines y and z) of the cushioning material to be required in the case where unevenness is not provided in the end portion on the joined side of the cushioning material, serves as the protrusion width of the protruding portion. A gap between the cushioning materials can be made hardly visible by arranging the opposed cushioning materials so that the respective positions of the protruding portions do not overlap each other in the joined portion. For example, in the example shown in FIG. 2C, a part of each end portion of the cushioning materials 17a, 17b is allowed to protrude by the distance that is twice the margin width so as to have a shape with a difference in level. In this case, the cushioning materials 17a, 17b can be attached to the P chassis 15 with a margin being set to 0. Even when the width of the gap between the cushioning materials 17a and 17b is the same as the width of the gap between the cushioning materials 87a and 87b, the length in a vertical direction (up-and-down direction of a display screen) of the gap varies. The length in the vertical direction of the gap shown in FIG. 2C is smaller. Therefore, when a screen is viewed, the gap in the example shown in FIG. 2C is made more hardly visible.

Figure 4A:
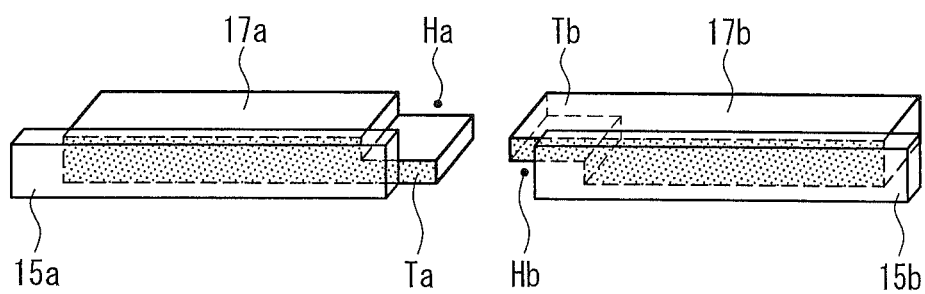
FIG. 4A is a view showing an example in which a cushioning material extends off an end portion on a joined side of a frame member.
Figure 4B:
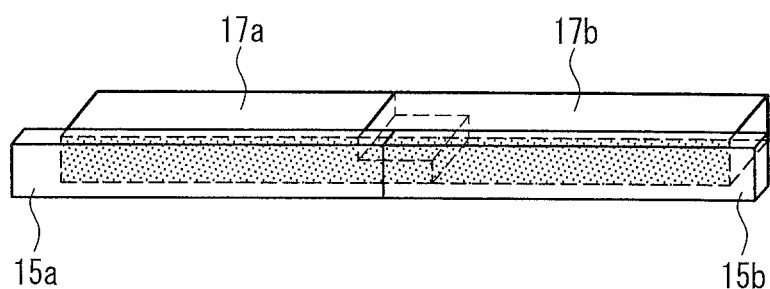
FIG. 4B is a view showing a state in which frame members shown in FIG. 4A are joined to each other.
Figure 5:
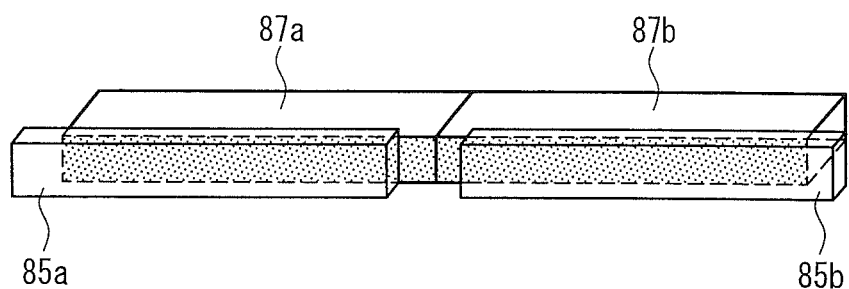
FIG. 5 is a view showing an example of a configuration in which a difference in level is not provided in a cushioning material.

Thus, a P chassis can be assembled even when a cushioning material extends off a frame member by using cushion rubber having a difference in level as the cushioning material. For example, as shown in FIG. 4A, the end portions of the cushioning materials 17a, 17b extend off the joined portion of the frame members 15a, 15b to the counterpart frame members. Even in this case, when the frame members 15a, 15b are joined to each other, the protruding portion Ta of the cushioning material 17a is fitted in the recessed portion Hb of the cushioning material 17b, and the protruding portion Tb of the cushioning material 17b is fitted in the recessed portion Ha of the cushioning material 17a, as shown in FIG. 4B. In contrast, in the case where a difference in level is not provided in the cushioning materials 87a, 87b as shown in FIG. 5, when the cushioning materials 87a, 87b are attached to positions extending off the frame members 85a, 85b, the frame members 85a, 85b cannot be joined to each other.

Further, for example, a cushioning material such as cushion rubber also has a function of preventing dust from entering a region between the display panel and the optical sheets from outside. In the present embodiment, it is also possible to improve the function. In the example shown in FIG. 2, the gap between the protruding portion Ta and the recessed portion Hb and the gap between the recessed portion Ha and the protruding portion Tb do not overlap each other. Thus, a gap that passes through an outer side and an inner side of a frame body can be eliminated, and hence dust becomes unlikely to enter the inner side of the frame body from the outer side thereof.

As described above, according to the present embodiment, a gap can be made hardly visible from a viewing direction of the screen of the display device. Further, dust can also be prevented from entering from an outer direction. In the above-mentioned embodiment, the frame members 15a and 15b are examples of the first and second frame members; however, the first and second frame members of the present invention are not limited thereto.

Further, how to recognize a protruding portion and a recessed portion is not limited to the above-mentioned example. For example, the protruding portion and the recessed portion can also be recognized as follows. That is, when a surface perpendicular to a display surface between a portion (for example, a position indicated by the dotted line "z" in FIG. 2A) protruding most to a second frame member to be joined to a first frame member and a portion (for example, a position indicated by the dotted line "x") recessed most inwardly is assumed to be a reference surface (for example, a surface passing through the dotted line "y") in an end portion of a cushioning material of the first frame member, a portion on the first frame member side from the reference surface can be defined as a protruding portion and a portion on an inner side from the reference surface can be defined as a recessed portion.

Embodiment 2

Embodiment 2 is a modified example of a cushioning material of a frame body for holding the circumferential end portion of a display panel. In the present embodiment, the thickness of a protruding portion of a cushioning material provided along a display surface side of a display panel is set to be smaller than the thickness of a recessed portion of the cushioning material.

Figure 6B:
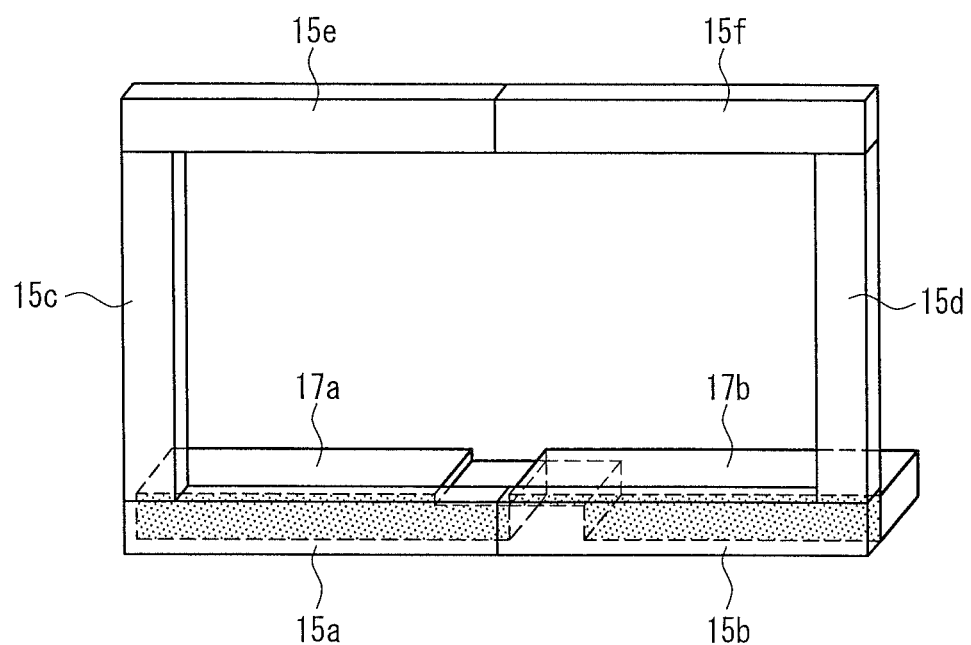
FIG. 6B is a view showing an example of a frame body formed through use of the frame members shown in FIG. 6A.
Figure 6A:
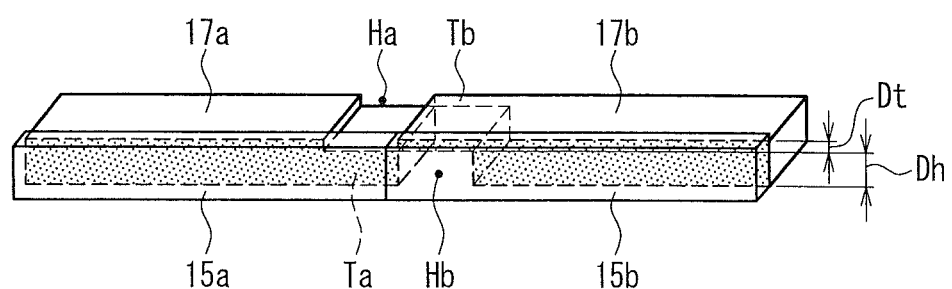
FIG. 6A is a view showing a configuration example of two frame members and cushioning materials in Embodiment 2.

FIG. 6A is a view showing a configuration example of two frame members and cushioning materials in Embodiment 2. FIG. 6B is a view showing an example of a frame body formed through use of the frame members shown in FIG. 6A. In the example shown in FIGS. 6A and 6B, the protruding portion Tb of the cushioning material 17b of the frame member 15b is provided on the display surface side (inner side of the frame) along the display surface. A thickness Dt in a cross-section parallel to the display surface of the protruding portion Tb is smaller than a thickness Dh of the recessed portion Hb of the cushioning material 17b of the frame member 15b.

That is, the end portion on the joined portion side of the cushioning material 17b has a portion (protruding portion) protruding further compared with the remaining portion on the display surface side (inner side of the frame) in the cross-section parallel to the display surface. The thickness of the protruding portion on the display surface side is smaller than the thickness of the remaining portion other than the protruding portion, that is, the recessed portion. Therefore, the thickness of the recessed portion Ha of the cushioning material 17 corresponding to the protruding portion Tb of the cushioning material 17b is smaller than the thickness of the protruding portion Ta of the cushioning material 17a. The cushioning materials 17a, 17b have a difference in level from the inner side to the outer side of the frame, and the width of a step on an innermost side of the frame is smaller than the width of the other steps.

Thus, a gap can be made more hardly visible by varying the height of a difference in level of cushion rubber, for example, setting the height of a step which is visible from the display screen to be small and setting the height of a step which is invisible from the screen to be high. Further, the effect of preventing dust from entering from outside is also exhibited in the shape shown in FIG. 6. According to the present embodiment, a gap from a viewing direction of a screen can be made more hardly visible. Further, dust from an outer direction can also be prevented from entering.

(Modified Example of Shape of Cushioning Material)

The shape of a cushioning material is not limited to the example shown in FIG. 6. In FIG. 6, although one protruding portion and one recessed portion appear in an end portion of a cushioning material, a plurality of protruding portions or recessed portions may appear in the end portion of the cushioning material. For example as shown in FIG. 7, a center portion may protrude and the peripheral portions thereof may be recessed inwardly in an end portion of the cushioning material 17a.

Figure 7A:
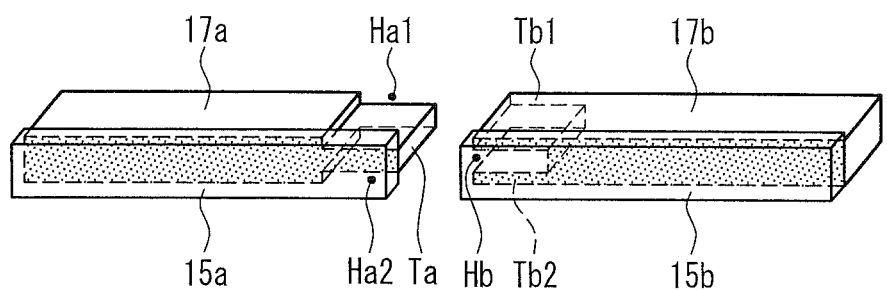
FIG. 7A is a view showing a configuration example of two adjacent frame members of those forming a frame body and cushioning materials.
Figure 7B:
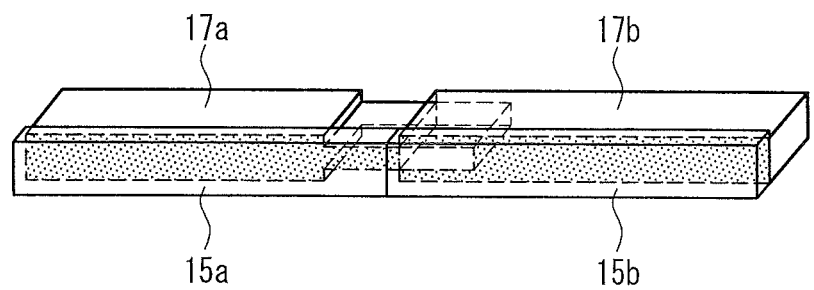
FIG. 7B is a view showing an example in which the frame members shown in FIG. 7A are joined to each other.

FIG. 7A is a view showing a configuration example of two adjacent frame members 15a, 15b of frame members forming a frame body and cushioning materials 17a, 17b attached thereto. FIG. 7B is a view showing an example in which the frame members 15a, 15b shown in FIG. 7A are joined to each other. In the example shown in FIGS. 7A and 7B, the center portion in the end portion of the cushioning material 17a of the frame member 15a is provided with a protruding portion Ta in which a cross-section on a surface parallel to a display surface is rectangular. Spaces on both sides of the protruding portion Ta in the center portion serve as recessed portions Ha1 and Ha2.

In the end portion of the cushioning material 17b of the frame member 15b, protruding portions Tb1, Tb2 are provided at positions opposed to the recessed portions Ha1, Ha2 of the cushioning material 17a during joining. That is, the end portion on a side close to the display surface of the cushioning material 17b and the end portion on a side far away from the display surface are respectively provided with the protruding portions Tb1, Tb2. The shapes of the protruding portions Tb1, Tb2 correspond to the recessed portions Ha1, Ha2 of the cushioning material 17a. For example, it is preferred that the protruding portions Tb1, Tb2 be shaped so as to be fitted in the recessed portions Ha1, Ha2. A region sandwiched between the protruding portions Tb1, Tb2 serves as the recessed portion Hb. In this case, the protruding portion Tb1 on a side close to the display surface extends along the display surface, and the thickness of the protruding portion Tb1 is smaller than the thickness of the portions other than the protruding portion Tb1 (total thickness of the recessed portion Hb and the protruding portion Tb2).

Figure 8A:
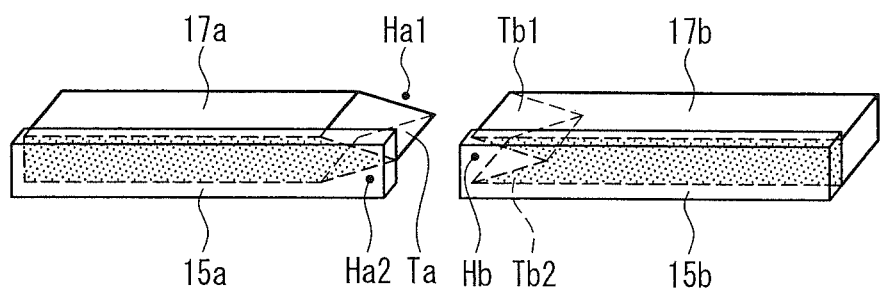
FIGS. 8A and 8B are views showing another modified example of a cushioning material.
Figure 8B:
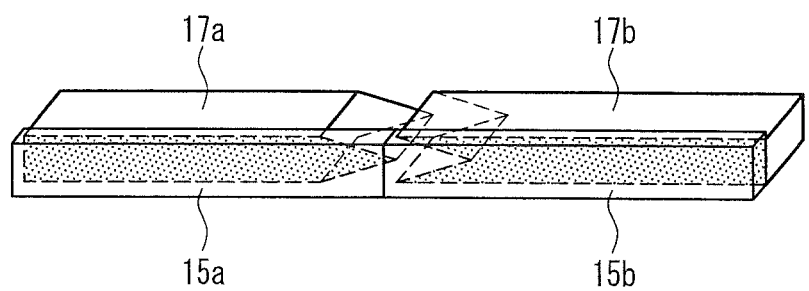

FIGS. 8A and 8B are views showing another modified example of a cushioning material. In the example shown in FIGS. 8A and B, the center portion in the end portion of a cushioning material 17a is provided with a protruding portion Ta having a triangular cross-section. Spaces on both sides of the protruding portion Ta serve as recessed portions Ha1, Ha2. A recessed portion Hb having a triangular cross-section is provided in the center portion in the end portion of a cushioning material 17b at a position opposed to the protruding portion Ta during joining. Protruding portions Tb1, Tb2 are formed on both sides of the recessed portion Hb. The protruding portion Tb1 on a side close to the display surface extends along the display surface. The thickness of the protruding portion Tb1 can also be set to be smaller than the thickness of the remaining portion (thickness of the protruding portion Tb2).

Figure 9A:
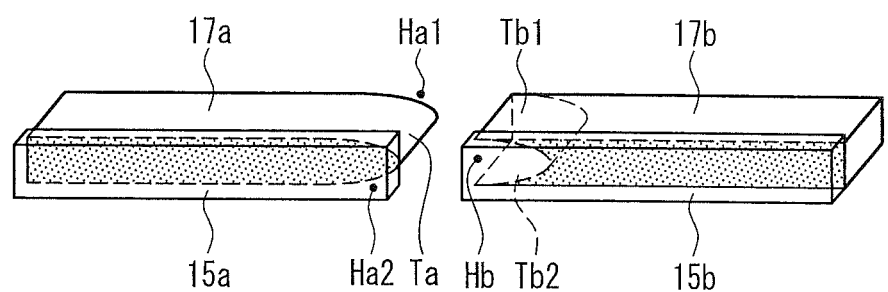
FIGS. 9A and 9B are views showing still another modified example of a cushioning material.
Figure 9B:
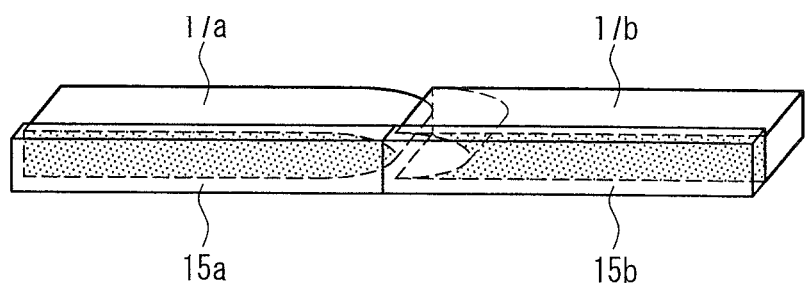

FIGS. 9A and 9B are views showing still another modified example of a cushioning material. In the example shown in FIGS. 9A and 9B, the width of a cross-section parallel to the display surface in the end portion of a cushioning material 17a is tapered down toward the tip along a curved line. A portion in which the width of the tip end of the cushioning material 17a becomes smaller serves as a protruding portion Ta. Spaces on both sides of the protruding portion Ta serve as recessed portions Ha1, Ha2. In an end portion of a cushioning material 17b, a recessed portion Hb having a shape along the surface of the protruding portion Ta of the cushioning material 17a is formed. Protruding portions Tb1, Tb2 are formed on both sides of the recessed portion Hb. A protruding portion Tb1 closer to the display surface is formed so as to extend along the display surface. The thickness of the protruding portion Tb1 can be set to be smaller than the thickness of the remaining portion (total thickness of a protruding portion Tb2).

Figure 10A:
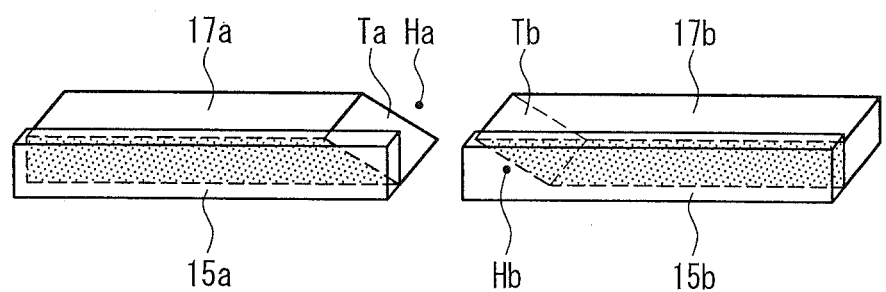
FIGS. 10A and 10B are views showing still another modified example of a cushioning material.
Figure 10B:
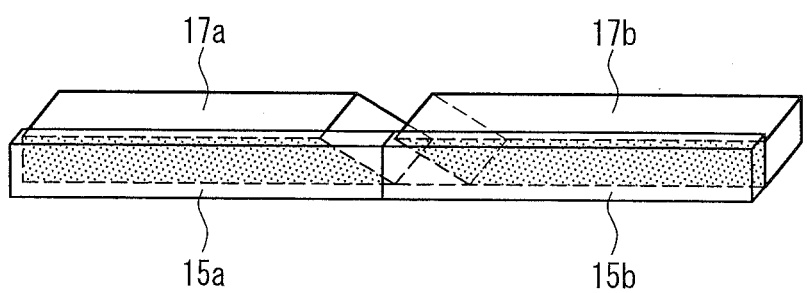

FIGS. 10A and 10B are views showing still another modified example of a cushioning material. In the example shown in FIGS. 10A and 10B, the end portion of a cushioning material 17a has a triangular cross-section and has a protruding portion Ta in a shape extending along one surface (as an example, a surface directed to an outer side of a frame body) of the cushioning material 17a. The end portion of a cushioning material 17b has a triangular cross-section and has a protruding portion Tb in a shape extending along one surface (as an example, a surface directed to the inner side of the frame member) of the cushioning material 17b. That is, the end portion of the cushioning material 17a has an inclined surface with respect to a joined surface between frame members 15a, 15b, and the end portion of the cushioning material 17b has an inclined surface which has the same tilt as that of the inclined surface of the end portion of the cushioning material 17a and which is opposite in direction thereto. In this example, a gap between the cushioning materials 17a, 17b can be made hardly visible with a simple shape.

Figure 11A:
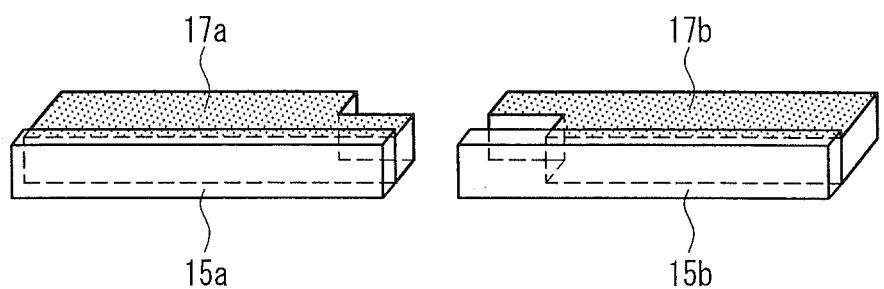
FIGS. 11A and 11B are views showing still another modified example of a cushioning material.
Figure 11B:
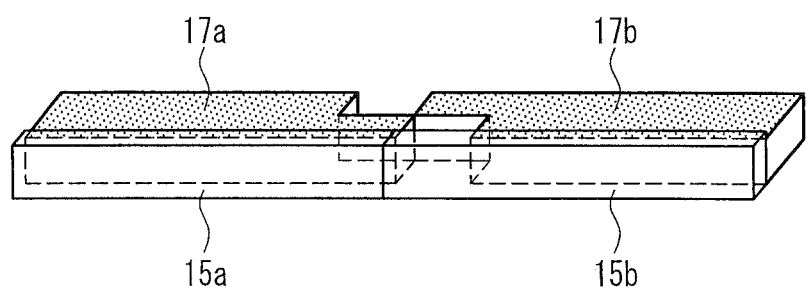

In the above-mentioned example, the protruding portion of the cushioning material has a shape protruding in a cross-section parallel to the display surface, and the recessed portion is recessed in the cross-section. However, the shapes of the protruding portion and the recessed portion are not limited thereto. For example, as shown in FIGS. 11A and 11B, the protruding portion or the recessed portion can have a shape protruding or recessed in a cross-section perpendicular to the display surface of the cushioning material. With such a shape, a gap between the cushioning materials can be made hardly visible. For example, the configuration shown in FIG. 11 exhibits an effect in particular to viewing at a small angle.

The modified examples of a cushioning material are described above; however, the modified examples of the cushioning material are not limited to the above-mentioned modified examples.

Embodiment 3

Figure 12A:
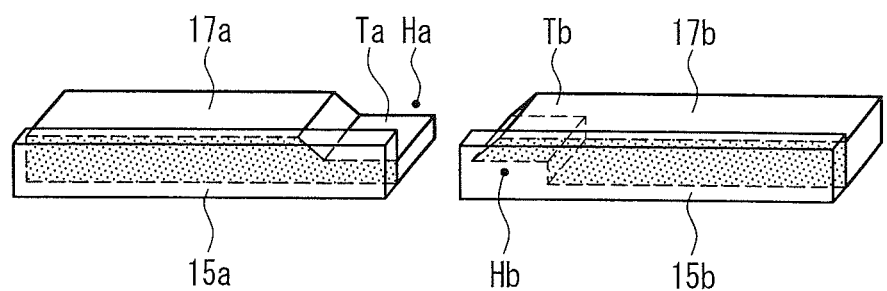
FIG. 12A is a view showing a configuration example of two frame members and cushioning materials in Embodiment 3.
Figure 12B:
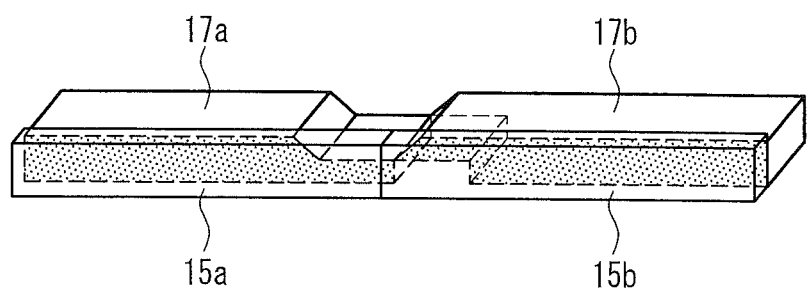
FIG. 12B is a view showing a state in which the frame members shown in FIG. 12A are joined to each other.

Embodiment 3 is a modified example of a frame member for holding an end portion of a display panel. In the present embodiment, the distance between a protruding portion along a display surface of a cushioning material of frame members to be joined to each other and a recessed portion of a cushioning material corresponding to the protruding portion becomes smaller with distance from the display surface. FIG. 12A is a view showing a configuration example of two frame members and cushioning materials in Embodiment 3. FIG. 12B is a view showing a state in which the frame members shown in FIG. 12A are joined to each other.

In the example shown in FIGS. 12A and 12B, a protruding portion Tb in an end portion of a cushioning material 17b is provided on a display surface side of a liquid crystal panel 2 along the display surface. That is, the protruding portion Tb is formed so as to extend in the joined direction along a surface on an inner side of a frame formed of the frame member 15b. The protrusion of the protruding portion Tb becomes larger with distance from the display surface (from the inner side of the frame to an outer side thereof).

In an end portion of the cushioning material 17a, a recessed portion Ha is provided at a position corresponding to the protruding portion of the cushioning material 17b. The inward recess of the recessed portion Ha becomes smaller with distance from the display surface.

As shown in FIG. 12B, when the frame members 15a, 15b are joined to each other, a gap between the recessed portion Ha on an innermost side (display surface side) and the protruding portion Tb on an innermost side, opposed to the recessed portion Ha, becomes smaller from the inner side to the outer side in the opposed cushioning materials 17a, 17b. Therefore, a gap visible from the display surface has a shape that is hardly visible.

According to the present embodiment, the shape of a gap between the protruding portion and the recessed portion can be made hardly visible by imparting a tilt to the protruding portion on the display surface side of the opposed cushioning materials and the recessed portion opposed to the protruding portion. It should be noted that, although the inclined surface is a flat surface in the example shown in FIG. 12, it may be a curved surface.

Embodiment 4

In Embodiments 1 to 3, the longitudinal directions of frame members to be joined to each other are parallel to each other.

Embodiment 4 is an example in which the longitudinal directions of frame members to be joined to each other are orthogonal to each other. In this embodiment, a protruding portion and a recessed portion are also provided in each end portion of cushioning materials of frame members to be joined to each other. The protruding portion and the recessed portion to be opposed to each other have complementary shapes.

Figure 13:
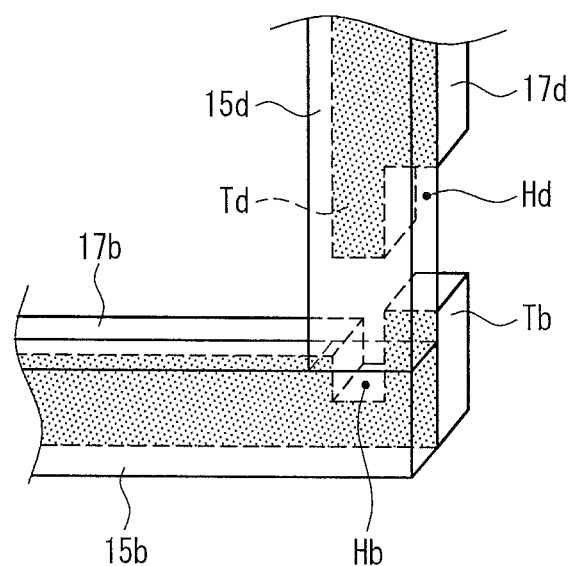
FIG. 13 is a view showing a configuration example of a cushioning material in the case where longitudinal directions of frame members to be joined form a right angle.

FIG. 13 is a view showing a configuration example of cushioning materials in the case where the longitudinal directions of two frame members to be joined to each other are orthogonal to each other. In the example shown in FIG. 13, a frame member 15b forming a lower right portion of a frame is joined to a frame member 15d that is adjacent to the frame member 15b and forms a right side portion of the frame. In a joined portion between the frame members 15b and 15d, a cushioning material 17b of the frame member 15b has a protruding portion Tb protruding toward the frame member 15d and a recessed portion Hb recessed inwardly. In the joined portion, a cushioning material 17d of the frame member 15d has a recessed portion Hd recessed inwardly so as to correspond to the protruding portion Tb of the cushioning material 17b and a protruding portion Td protruding so as to correspond to the recessed portion Hb of the cushioning material 17b.

Accordingly, the cushioning materials of the frame members to be joined to each other at a right angle can also be provided with protruding portions, with the result that a gap between the cushioning materials can be made hardly visible from a display surface.

Other Modified Examples, Etc.

The present invention is not limited to Embodiments 1 to 4. For example, a display unit (display device) to which the present invention is applicable is not limited to a liquid crystal display device having a liquid crystal panel. The present invention is applicable to, for example, display devices having a frame body for supporting a display panel, such as an organic EL display and a plasma display.

DESCRIPTION OF REFERENCE SYMBOLS 1 liquid crystal display device (display device)
2 liquid crystal panel (display panel)
3 backlight device (base portion)
4 light-emitting diode
13 BL chassis
15 P chassis (frame body)
15a to 15f frame member
16 bezel
17 cushioning material

The invention claimed is:

1. A display device, comprising:
a display panel; and
a frame body formed by joining a plurality of frame members for supporting a circumferential end portion of the display panel,
wherein a cushioning material is provided on each of the plurality of frame members, and
a cushioning material of a first frame member of the plurality of frame members includes a protruding portion protruding toward a second frame member to be joined to the first frame member and a recessed portion recessed inwardly in an end portion, and a cushioning material of the second frame member includes a recessed portion recessed inwardly so as to correspond to the protruding portion of the cushioning material of the first frame member and a protruding portion protruding so as to correspond to the recessed portion of the cushioning material of the first frame member.

2. The display device according to claim 1, wherein the protruding portion of the cushioning material of the first frame member is provided on a display surface side of the display panel along the display surface.

3. The display device according to claim 1, wherein the protruding portion of the cushioning material of the first frame member is provided on a display surface side of the display panel along the display surface, and a thickness of the protruding portion of the cushioning material of the first frame member is smaller than a thickness of a remaining portion of the cushioning material of the first frame member.

4. The display device according to claim 1, wherein the protruding portion of the cushioning material of the first frame member is provided on the display surface side of the display panel along the display surface, and the protruding portion has a shape in which a protrusion becomes large with distance from the display surface, and the recessed portion of the cushioning material of the second frame member corresponding to the protruding portion has a shape in which an inward recess becomes small with distance from the display surface.

5. The display device according to claim 1, wherein a gap between the protruding portion of the cushioning material of the first frame member and the recessed portion of the cushioning material of the second frame member and a gap between the recessed portion of the cushioning material of the first frame member and the protruding portion of the cushioning material of the second frame member are disposed so as not to overlap each other under a condition that the first frame member and the second frame member are joined to each other.

6. The display device according to claim 1, wherein the frame body is provided between the display panel and an illumination unit for illuminating the display panel with light, and
the cushioning material is provided between the frame body and the illumination unit.

7. The display device according to claim 1, wherein the display panel is a liquid crystal display panel.

8. A plurality of frame members forming a frame body for supporting a circumferential end portion of a display panel by being joined to each other,
wherein a cushioning material is provided on each of the plurality of frame members, and
a cushioning material of a first frame member of the plurality of frame members includes a protruding portion protruding toward a second frame member to be joined to the first frame member and a recessed portion recessed inwardly in an end portion, and a cushioning material of the second frame member includes a recessed portion recessed inwardly so as to correspond to the protruding portion of the cushioning material of the first frame member and a protruding portion protruding so as to correspond to the recessed portion of the cushioning material of the first frame member.

* * * * *